United States Patent
Kawai (10) Patent No.: US 8,596,092 B2
(45) Date of Patent: Dec. 3, 2013

(54) METHOD OF MANUFACTURING THROUGH ELECTRODE-ATTACHED GLASS SUBSTRATE

(75) Inventor: Noboru Kawai, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/135,497

(22) Filed: Jul. 7, 2011

(65) Prior Publication Data

US 2012/0006467 A1 Jan. 12, 2012

(30) Foreign Application Priority Data

Jul. 8, 2010 (JP) ................................ 2010-156170

(51) Int. Cl.
*C03C 27/02* (2006.01)

(52) U.S. Cl.
USPC .............. 65/59.1; 65/56; 65/59.25; 65/59.26; 65/59.21

(58) Field of Classification Search
USPC ....................... 65/138–140, 36, 59.1, 146–149
See application file for complete search history.

(56) References Cited

U.S. PATENT DOCUMENTS

| | | | | |
|---|---|---|---|---|
| 2,287,598 A | * | 6/1942 | Brown | 65/59.1 |
| 2,388,242 A | * | 11/1945 | Arndt, Jr. | 310/331 |
| 2,608,722 A | * | 9/1952 | Stuetzer | 29/592.1 |
| 3,004,368 A | * | 10/1961 | Hicks, Jr. | 65/411 |
| 3,129,463 A | * | 4/1964 | Gill, Jr. et al. | 425/110 |
| 3,276,854 A | * | 10/1966 | Felker et al. | 156/50 |
| 3,319,318 A | * | 5/1967 | Taimuty | 29/423 |
| 3,360,849 A | * | 1/1968 | Forman et al. | 228/110.1 |
| 3,369,883 A | * | 2/1968 | Smith | 65/112 |
| 3,400,291 A | * | 9/1968 | Emanuel | 313/528 |
| 3,593,219 A | * | 7/1971 | Tsuchiya | 333/192 |
| 3,633,270 A | * | 1/1972 | Deradoorian | 29/592.1 |
| 3,779,804 A | * | 12/1973 | Urban | 257/744 |
| 3,887,887 A | * | 6/1975 | Wagers et al. | 333/151 |
| 4,127,398 A | * | 11/1978 | Singer, Jr. | 65/393 |
| 4,648,892 A | * | 3/1987 | Kittrell et al. | 65/387 |
| 4,670,074 A | * | 6/1987 | Broussoux et al. | 156/198 |
| 4,721,543 A | * | 1/1988 | Wolfson | 156/380.2 |
| 5,008,176 A | * | 4/1991 | Kondo et al. | 430/270.11 |
| 5,314,522 A | * | 5/1994 | Kondo et al. | 65/31 |
| 5,544,004 A | * | 8/1996 | Inagaki et al. | 361/633 |
| 5,997,999 A | * | 12/1999 | Horiuchi et al. | 428/210 |
| 6,576,991 B1 | * | 6/2003 | Bonvalot et al. | 257/680 |

(Continued)

FOREIGN PATENT DOCUMENTS

| | | | |
|---|---|---|---|
| JP | 07267664 A | * | 10/1995 |
| JP | 2002121037 | | 4/2002 |

(Continued)

*Primary Examiner* — Jodi C Franklin
(74) *Attorney, Agent, or Firm* — Adams & Wilks (57) ABSTRACT

In a method of manufacturing a through electrode-attached glass substrate, electrode through holes and at least one dummy through hole are formed in a plate-shaped glass, and electrode members are inserted into the electrode through holes but not into the at least one dummy through-hole. The plate-shaped glass and the electrode members are welded by heating the plate-shaped glass at a temperature higher than a softening point of the plate-shaped glass so that the glass is allowed to flow into the at least one dummy through hole. Opposite surfaces of the plate-shaped glass are ground together with the electrode members so as to expose the electrode members to the opposite surfaces of the plate-shaped glass and to configure the electrode members as through electrodes that are electrically separated from each other.

4 Claims, 10 Drawing Sheets

HEATING AND
PRESSURIZING SUB-PROCESS S3a

(56) References Cited

U.S. PATENT DOCUMENTS

| | | | |
|---|---|---|---|
| 6,813,904 B2* | 11/2004 | Elledge | 65/102 |
| 7,484,279 B2* | 2/2009 | Aoki | 29/25.35 |
| 8,033,142 B2* | 10/2011 | Pedrido | 65/412 |
| 8,101,913 B2* | 1/2012 | Ivanov et al. | 250/336.1 |
| 2001/0049188 A1* | 12/2001 | Umemoto | 438/630 |
| 2003/0107146 A1* | 6/2003 | Hosoe et al. | 264/81 |
| 2003/0145461 A1* | 8/2003 | Kasai et al. | 29/832 |
| 2003/0167796 A1* | 9/2003 | Hawtof | 65/17.4 |
| 2003/0198872 A1* | 10/2003 | Yamazoe et al. | 430/5 |
| 2003/0230118 A1* | 12/2003 | Dawes et al. | 65/379 |
| 2004/0050110 A1* | 3/2004 | Berkey et al. | 65/393 |
| 2004/0227241 A1* | 11/2004 | Enomoto | 257/751 |
| 2005/0183282 A1* | 8/2005 | Watanabe et al. | 33/836 |
| 2005/0191841 A1* | 9/2005 | Aoyama et al. | 438/619 |
| 2007/0058003 A1* | 3/2007 | Aoki | 347/68 |
| 2007/0216736 A1* | 9/2007 | Akahane et al. | 347/68 |
| 2008/0026188 A1* | 1/2008 | D'urso et al. | 428/188 |
| 2009/0038153 A1* | 2/2009 | Chu et al. | 29/890.03 |
| 2009/0212372 A1* | 8/2009 | Yamasaki | 257/369 |
| 2009/0317749 A1* | 12/2009 | Lee | 430/319 |
| 2010/0078810 A1* | 4/2010 | Matsui et al. | 257/737 |
| 2011/0061478 A1* | 3/2011 | Ivanov et al. | 73/866 |
| 2012/0006060 A1* | 1/2012 | Terao | 65/41 |
| 2012/0006467 A1* | 1/2012 | Kawai | 156/154 |

FOREIGN PATENT DOCUMENTS

| | | |
|---|---|---|
| JP | 20021224845 | 4/2002 |
| JP | 2003209198 | 7/2003 |
| JP | 2004335614 | 11/2004 |
| JP | 2009115524 | 5/2009 |
| WO | 2009157305 | 12/2009 |

* cited by examiner

FIG.3A
GLASS PREPARING SUB-PROCESS S1a

FIG.3B
CONCAVE PORTION
FORMING SUB-PROCESS S1b

FIG.3C
CONCAVE PORTION
FORMING SUB-PROCESS S1c

FIG.3D
PASS-THROUGH SUB-PROCESS S1c

FIG.3E
ELECTRODE INSERTING PROCESS S2

FIG.3F
HEATING AND
PRESSURIZING SUB-PROCESS S3a

FIG.3G
EXTRACTION SUB-PROCESS S3b

FIG.3H
GRINDING PROCESS S4

METHOD OF MANUFACTURING THROUGH ELECTRODE-ATTACHED GLASS SUBSTRATE

BACKGROUND OF THE INVENTION

1. Field of the Invention

The present invention relates to a method of manufacturing a glass substrate in which a plurality of through electrodes is formed in the glass substrate and a method of manufacturing an electronic component using the method.

SUMMARY OF THE INVENTION

2. Background Art

Recently, piezoelectric vibrators using quartz crystal or the like are used in time sources or timing sources of cellular phones or mobile information terminal devices. There are many types of piezoelectric vibrators, and, as one of them, a piezoelectric vibrator of a surface mounting type is known. As such a piezoelectric vibrator, a three-layer structure type is known in which a piezoelectric substrate, in which a piezoelectric vibrating piece is formed, is vertically interposed and bonded between a base substrate and a lid substrate. The piezoelectric vibrating piece is housed inside a cavity that is configured between the base substrate and the lid substrate.

In addition, recently, piezoelectric vibrators of a two-layer structure type are being developed. This type is configured by a package of a two-layer structure type in which a base substrate and a lid substrate are directly bonded to each other, and a piezoelectric vibrating piece is housed inside a cavity that is configured between the base substrate and the lid substrate. A piezoelectric device of the two-layer structure type has advantages over a piezoelectric device of the three-layer structure type in that the thickness thereof can be formed thin and the like.

In JP-A-2002-124845 and JP-A-2002-121037, quartz crystal vibrator packages of the two-layer structure type are disclosed. As the package material of the base substrate and the lid substrate, glass is used. Since glass is used, molding can be performed in a relatively easy manner, and the manufacturing cost can be lower than that of a case where ceramics are used. In addition, since glass has a low thermal conductivity coefficient, the thermal insulating properties thereof are superior, whereby a piezoelectric vibrator disposed therein can be protected from changes in temperature.

Figure 15A:
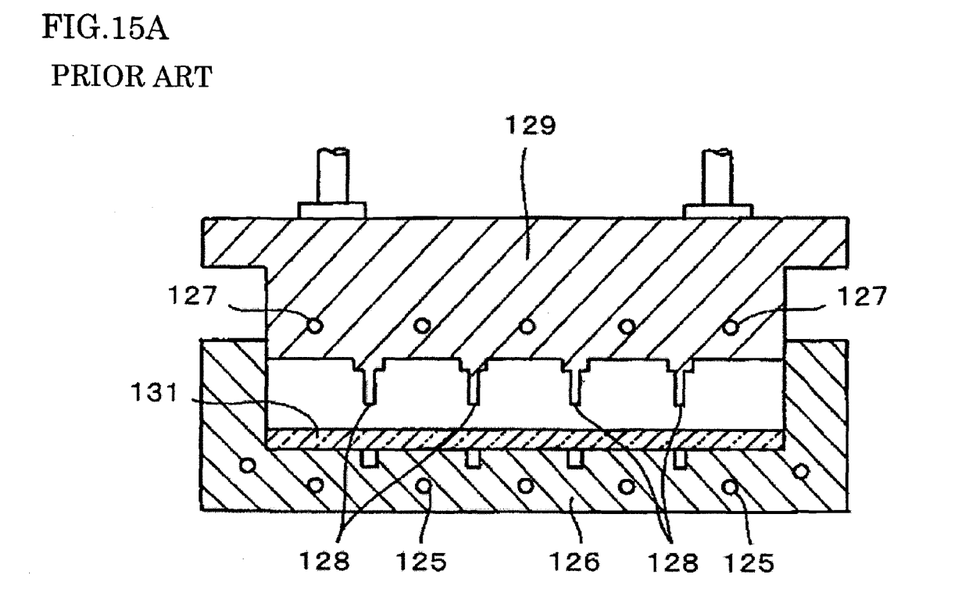
FIGS. 15A and 15B illustrate a conventional known method in which through holes are formed in a glass plate and pins are driven therein.
Figure 15B:
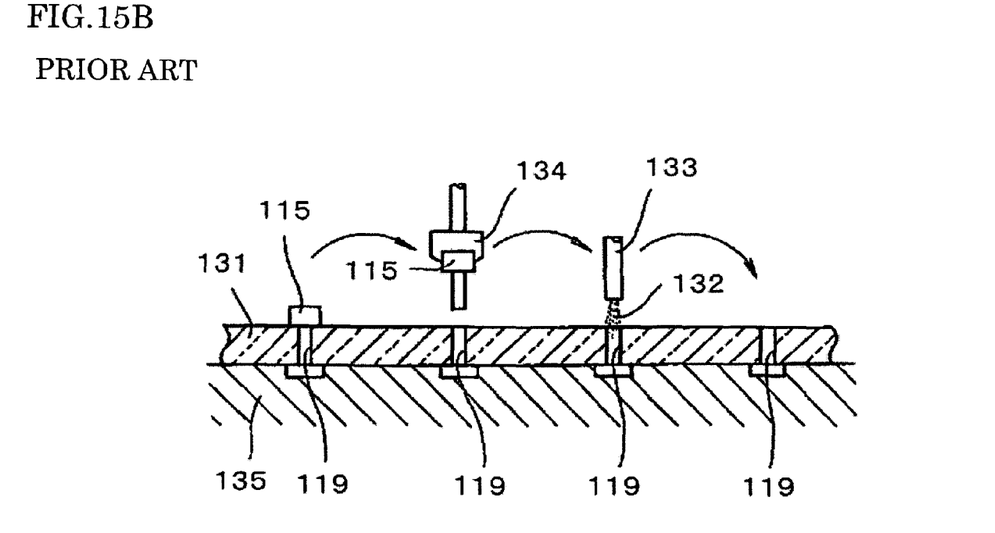

In JP-A-2003-209198, a method of simultaneously forming a plurality of quartz crystal vibrator packages of the two-layer structure type as described above is disclosed. In this case, a method is disclosed in which glass is used as the material of a base substrate, and through electrodes formed from a metal material are formed in the base substrate. When the through electrodes are formed in the glass, first, through holes are formed in a glass plate. FIGS. 15A and 15B illustrate a method of forming through electrodes formed of metal pins 115 in the glass plate 131 (FIG. 3 in JP-A-2003-209198). FIG. 15A illustrates a method of forming through holes 119 in the glass plate 131. The glass plate 131 is arranged at the bottom of a die 126. In the die 126, a heater 125 is installed and can apply heat to the glass plate 131. On the upper side of the die 126, a punching machine configured by a puncher 129 is installed. On the side of the puncher 129 that is the glass plate 131 side, drilling pins 128 are installed, and a heater 127 is installed in the puncher 129 as well. After the glass plate 131 is heated at a predetermined temperature, the puncher 129 is lowered so as to form the through holes 119.

FIG. 15B illustrates a method of driving metal pins 115 into the through holes 119 of the glass plate 131. The glass plate 131 in which the through holes 119 are formed is installed to a base 135, and glass frit 132 is blown to the through holes 119 by a glass frit blower 133, and the metal pins 115 are driven into the through holes 119 by a metal pin puncher 134.

Figure 16A:
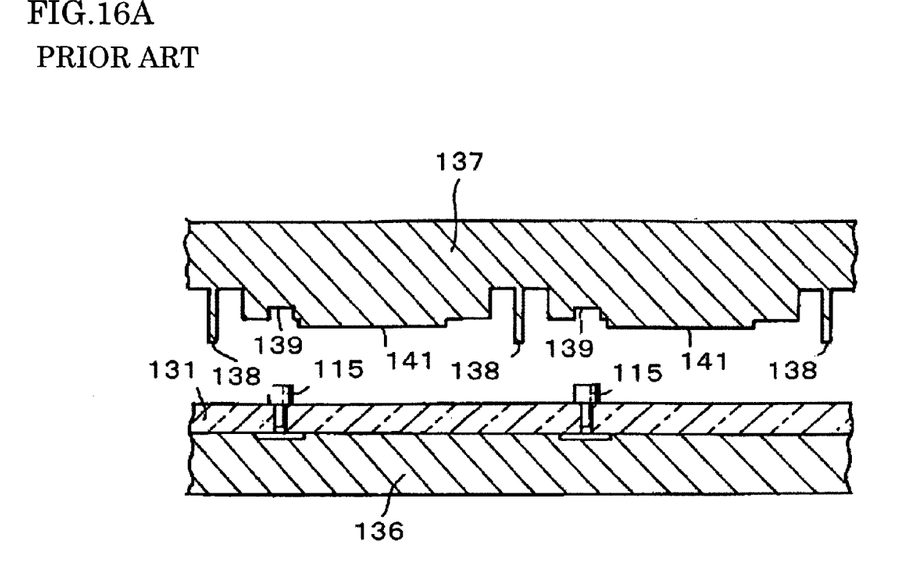
FIGS. 16A and 16B illustrate a state in which a glass plate is molded by using a conventional known press molding method.
Figure 16B:
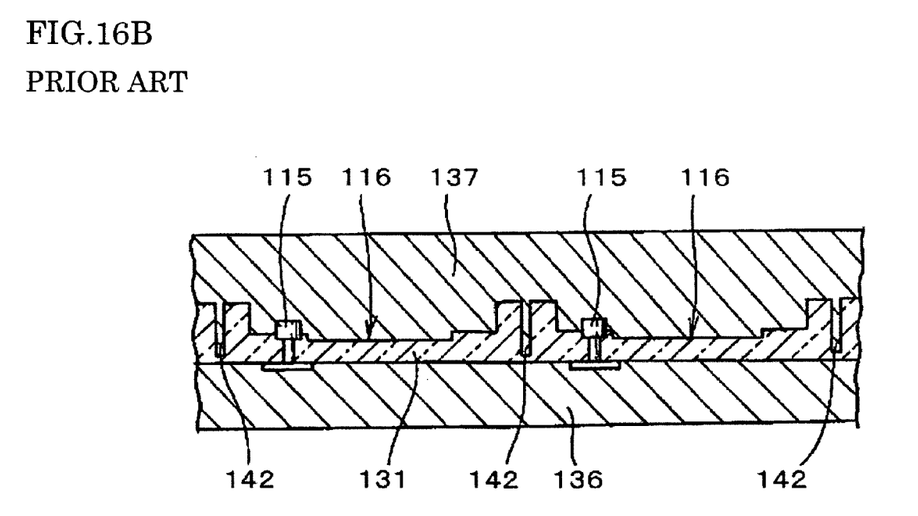

FIGS. 16A and 16B illustrate a press molding process (FIG. 4 of JP-A-2003-209198). As illustrated in FIG. 16A, the glass plate 131 in which the metal pins 115 are driven into the through holes 119 is installed between a pressing lower die 136 and a pressing upper die 137. In the pressing upper die 137, a partition convex ridge 138, a pinhead housing concave portion 139, and a concave-portion forming convex ridge 141 are formed. This die is input into an electric furnace and is heated at a temperature equal to or higher than 1000° C. while pressing the pressing upper die 137 to the pressing lower die 136. As a result, as illustrated in FIG. 16B, the concavity and convexity of the surface of the pressing upper die 137 is transferred onto the glass plate 131, and a division groove 142 and concave portions 116 are formed in the glass plate 131. Simultaneously, through electrodes that are configured by the metal pins 115 having sealability are formed in the glass plate 131.

However, when the metal pins 119 are inserted into the through holes 119 formed in the glass plate 131, the glass plate 131 is heated while being pressed by the pressing upper die 137 so as to weld the glass and the metal pin, and then the glass plate 131 and the metal pin 119 are cooled, internal stress is generated due to the flow of the glass or the non-uniformity of heat at the time of cooling, whereby the glass plate 131 is distorted in a complex manner. In a case where the bent state is to be corrected through grinding, when the glass plate 131 is thin, such a bent state cannot be eliminated. In addition, the amount of grinding increases, and the object of multiple patterning cannot be attained. Furthermore, in a case where the flatness of the surface of the sidewall surrounding the concave portion 116 is bad, the airtightness of a lid bonded to the surface cannot be acquired, and there is a problem in that the reliability of the electronic component is lowered.

The present invention is contrived in consideration of the above-described problems, and the object of the invention is to provide a through electrode-attached glass substrate having superior flatness.

According to an embodiment of the invention, there is provided a method of manufacturing a through electrode-attached glass substrate. The method includes: forming a plurality of electrode through holes and a dummy through hole in plate-shaped glass; inserting electrode members into the electrode through holes; welding the plate-shaped glass and the electrode members by heating the plate-shaped glass at a temperature that is higher than a softening point of the plate-shaped glass; and grinding both sides of the plate-shaped glass together with the electrode members so as to expose a plurality of the electrode members to the both sides of the plate-shaped glass as a plurality of through electrodes that are electrically separated from each other.

In addition, in the forming of a plurality of electrode through holes and a dummy through hole, a periphery of the dummy through hole may be surrounded by the electrode through holes.

In addition, in the forming of a plurality of electrode through holes and a dummy through hole, it may be configured such that a minimum area acquired by cutting out and separating the glass substrate is configured as a unit cell, the plurality of the electrode through holes is formed in the unit cell, and the dummy through hole is formed on a boundary between the unit cells adjacent to each other.

In addition, in the forming of a plurality of electrode through holes and a dummy through hole, when the plate-shaped glass is divided into n (here, n is a positive integer equal to or greater than two and equal to or less than eight) portions having an approximately similar area with a center point of the surface of the plate-shaped glass used as a center, the dummy through hole may be formed at an approximate center of the divided areas.

In addition, in the forming of a plurality of electrode through holes and a dummy through hole, it may be configured such that the plurality of electrode through holes is formed at a center area of the plate-shaped glass, and a plurality of the dummy through holes is formed in an outer periphery area located on an outer periphery side relative to the center area.

In addition, in the forming of a plurality of electrode through holes and a dummy through hole, the dummy through hole may be formed in a center portion of the plate-shaped glass.

In addition, in the forming of a plurality of electrode through holes and a dummy through hole, it may be configured such that a minimum area acquired by cutting out and separating the glass substrate is configured as a unit cell, the plurality of the electrode through holes is formed in the unit cell, and the dummy through hole is formed with a part of the unit cell used as a dummy unit cell.

In addition, in the forming of a plurality of electrode through holes and a dummy through hole, it may be configured such that a minimum area acquired by cutting out and separating the glass substrate is configured as a unit cell, and the electrode through holes and the dummy through hole are formed in the unit cell.

In addition, in the inserting of electrode members, a pin of each of the electrode members in which the pin is arranged so as to be erected on a base may be inserted into the electrode through hole.

In addition, in the welding of the plate-shaped glass and the electrode members, the plate-shaped glass into which the plurality of pins is inserted may be interposed between a receiving die and a pressurizing die and pressed.

In addition, the forming of a plurality of electrode through holes and a dummy through hole may include: forming a plurality of concave portions on one surface of the plate-shaped glass by arranging a plurality of convex portions in either a receiving die or a pressurizing die, which are formed from carbon materials, and interposing and heating the plate-shaped glass between the receiving die and the pressurizing die; and allowing the plurality of concave portions to pass through from the one surface to the other surface by grinding the other surface located on a side opposite to the one surface of the plate-shaped glass.

In addition, cooling the plate-shaped glass and the electrode members may be further included after the welding of the plate-shaped glass and the electrode members, wherein, in the cooling of the plate-shaped glass and the electrode members, a cooling rate for a range from a temperature higher than a strain point of the plate-shaped glass by 50° C. to a temperature lower than the strain point by 50° C. is configured to be slower than a cooling rate for a range up to a temperature higher than the strain point by 50° C.

According to another embodiment of the invention, there is provided a method of manufacturing an electronic component including: forming a glass substrate using any one of the above-described methods and forming electrodes in the glass substrate; forming electrodes in the glass substrate so as to be configured as a base substrate; mounting the electronic component on the base substrate; and bonding a lid substrate to the base substrate on which the electronic component is mounted.

A method of manufacturing a through electrode-attached plate-shaped glass according to the invention includes: forming a plurality of electrode through holes and a dummy through hole in plate-shaped glass; inserting electrode members into the electrode through holes; welding the plate-shaped glass and the electrode members by heating the plate-shaped glass at a temperature that is higher than a softening point thereof; and grinding both sides of the plate-shaped glass together with the electrode members so as to expose a plurality of the electrode members to both sides of the plate-shaped glass and configure the plurality of the electrode members as a plurality of through electrodes that are electrically separated from each other. Accordingly, the residual internal stress is alleviated, and therefore a through electrode-attached glass substrate having superior flatness and high airtightness can be formed.

DETAILED DESCRIPTION OF THE INVENTION

Figure 1:
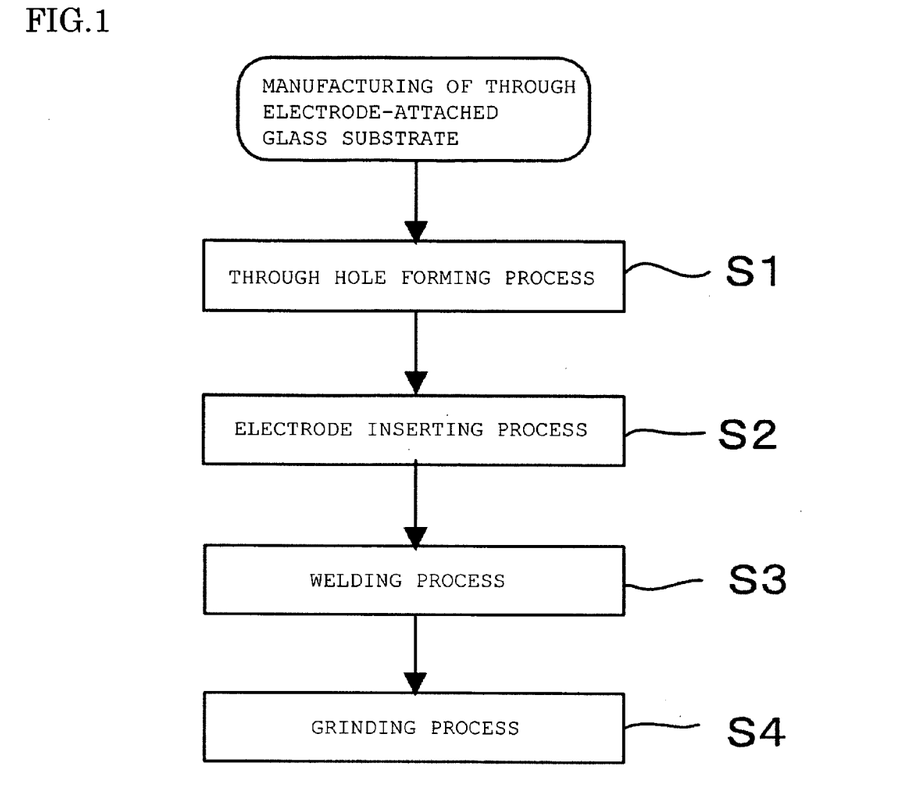
FIG. 1 is a process diagram illustrating a method of manufacturing a glass substrate according to an embodiment of the present invention.
Figure 2:
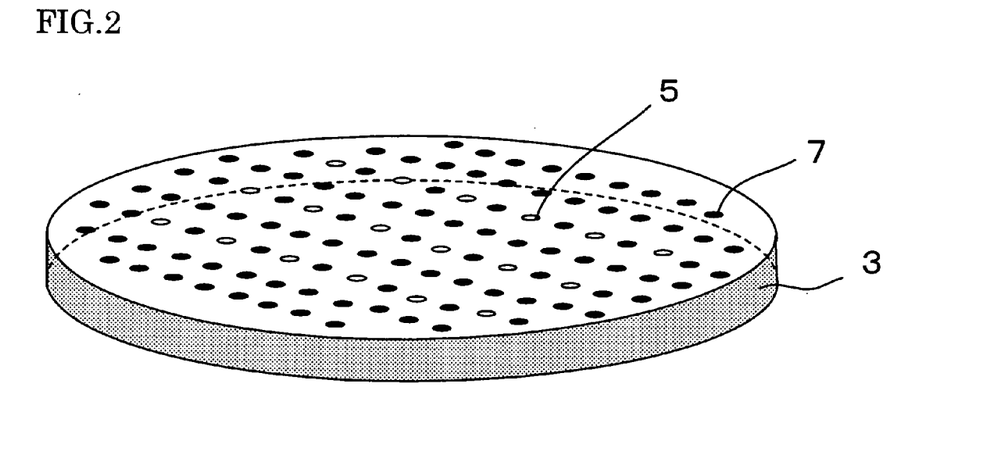
FIG. 2 is a diagram illustrating a method of manufacturing a glass substrate according to an embodiment of the invention and illustrates a process of forming the glass substrate.

FIG. 1 is a process diagram illustrating a method of manufacturing a through electrode-attached glass substrate according to an embodiment of the present invention and illustrates a basic configuration according to an embodiment of the invention. FIG. 2 is a perspective view of the through electrode-attached glass substrate 3. A through electrode-attached glass substrate according to an embodiment of the invention is used for concurrently packaging a plurality of electronic components. First, in a through hole forming process S1, a plurality of electrode through holes and dummy through holes are formed in a glass material. The number of the dummy through holes may be one or more. In the through hole forming process S1, through holes can be formed in a plate-shaped glass by sandblast, drill grinding, or shape molding and grinding. In a case where the through holes are formed by shape molding and grinding, through holes can be formed through a concave portion forming process in which a plurality of convex portions are arranged in either a receiving die or a pressurizing die, the plate-shaped glass is interposed between the receiving die and the pressurizing die and heated, and a plurality of concave portions are formed on one surface of the plate-shaped glass, and a pass-through process in which the plurality of concave portions passes through from one surface to the other surface by grinding the other surface located on the side opposite to the one surface of the plate-shaped glass on which the concave portions are formed.

Next, in an electrode inserting process S2, electrode members are inserted into the electrode through holes. Next, in a welding process S3, the plate-shaped glass is heated at a temperature higher than the softening point thereof whereby the plate-shaped glass and the electrode members are welded. Next, in a grinding process S4, both sides of the plate-shaped glass are ground together with the electrode members, thereby exposing the plurality of electrode members to both sides of the plate-shaped glass so as to be formed as a plurality of through electrodes electrically separated from each other. FIG. 2 is a perspective view of a glass substrate 3 manufactured as described above, and the plurality of through electrodes 7 and dummy through holes 5 are mixed together. As a result, the residual stress inside the glass decreases, whereby the flatness of the glass substrate 3 is improved. In addition, in the electrode inserting process S2, the pins of the electrode members, in which the pins are arranged so as to stand erect on the pedestal thereof, are inserted into the electrode through holes. Then, in a welding process S3, the plate-shaped glass, into which the corresponding pins are inserted, is interposed between the receiving die and the pressurizing die and can be heated while being pressed. Accordingly, the glass and the pins can be reliably welded in a short time.

Hereinafter, an example of the layout of the electrode through holes and the dummy through holes formed in the through hole forming process S1 will be described. First, the dummy through hole may be formed such that the periphery thereof is surrounded by the electrode through hole. In such a case, the internal stress generated on the periphery of the electrode through hole is alleviated by the dummy through hole, whereby the flatness of the glass substrate can be improved.

In addition, it may be configured such that a minimum area of the glass substrate that is cut out and separated as a single electronic component is configured as a unit cell, a plurality of electrode through holes is formed in the unit cell, and dummy through holes are be formed on the boundary of adjacent unit cells. In such a case, the internal stress generated inside the unit cell is alleviated by the dummy through hole, whereby the flatness of the glass substrate can be improved, and by forming the dummy through holes in the cutout area, the number of the unit cells that are obtained at the time of multiple patterning can be prevented from being reduced.

In addition, when the glass substrate is divided into n (here, $2 \leq n \leq 8$) portions having an almost similar area with the center point of the surface of the glass substrate used as the center thereof, the dummy through hole may be formed in an approximately center portion of the divided area. In such a case, since the internal stress generated within a predetermined area is alleviated by arranging the dummy through hole, the flatness of the entire glass substrate can be improved.

In addition, it may be configured such that a plurality of the electrode through holes are formed in the center area of the glass substrate, and a plurality of the dummy through holes are formed in an outer periphery area located on the outer periphery side relative to the center area of the glass substrate. In such a case, internal stress concentrated in the area located on the periphery side in which the through hole is not formed is reduced, whereby the flatness of the entire glass substrate can be improved. Furthermore, the dummy through hole may be formed in the center portion of the glass substrate. In such a case, the internal stress concentrated in the center portion of the glass substrate is reduced, whereby the flatness of the entire glass substrate can be improved.

In addition, it may be configured such that the minimum area acquired by cutting out and dividing the glass substrate is configured as a unit cell, a plurality of the electrode through holes is formed in each unit cell, and a part of the unit cells is configured as the dummy through hole. In such a case, the dummy through hole can be optimally arranged such that a bent state of the glass substrate does not occur.

In addition, the electrode through holes and the dummy through holes may be formed so as to be mixed in the unit cell. Then, in the welding process, by allowing the plate-shaped glass to flow, the dummy through holes can be closed. In such a case, the internal stress in each unit cell of the plate-shaped glass is alleviated, and accordingly, the distortion of the entire glass substrate is reduced, whereby the flatness thereof can be improved.

Here, as the plate-shaped glass, soda-lime glass, borosilicate glass, lead glass, or the like may be used. In addition, as the material of the electrode member, a Ni—Fe alloy, for example, a "42 alloy" or kovar may be used. By using such an alloy, the thermal expansion coefficient can be approximated to that of the glass, and accordingly, the deterioration of the boundary between the glass and the through electrode due to a thermal change can be prevented.

In addition, in a cooling process in which the plate-shaped glass is cooled after the welding process S3, the cooling rate for the range of temperatures higher than the strain point of the glass substrate by 50° C. to temperatures lower than the strain point by 50° C. can be configured to be slower than that for the range up to a temperature higher than the strain point by 50° C. In such a case, the distortion remaining on the glass substrate is reduced, and accordingly, a gap or a crack between a wire and the glass substrate is prevented, whereby the through electrode having high airtightness can be formed. Hereinafter, embodiments of the present invention will be described with reference to the drawings.

First Embodiment

Figure 3A:
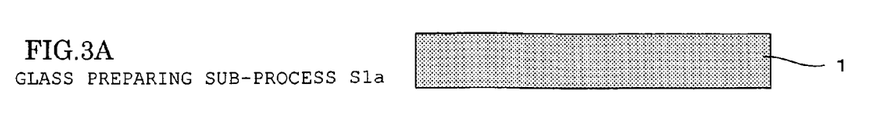
FIGS. 3A to 3H are diagrams illustrating a method of manufacturing a glass substrate according to an embodiment of the invention.
Figure 3B:
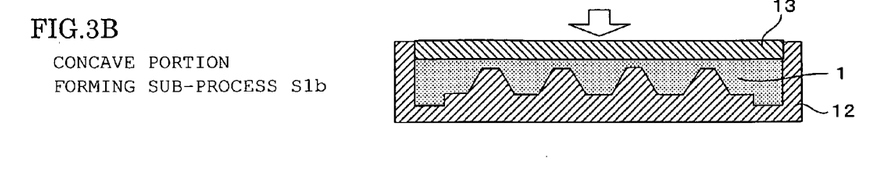

FIGS. 3A to 3H are diagrams illustrating a method of manufacturing a glass substrate according to a first embodiment of the invention. Hereinafter, the description will be followed with reference to the drawings. First, a through hole forming process S1 will be described. The through hole forming process S1 includes a glass preparing sub-process S1a, a concave portion forming sub-process S1b, and a pass-through sub-process S1c. In the glass preparing sub-process S1a, as illustrated in FIG. 3A, plate-shaped glass 1 is prepared. As the plate-shaped glass 1, soda-lime glass is used. Next, in the concave portion forming sub-process S1b, as illustrated in FIG. 3B, the plate-shaped glass 1 is interposed between a receiving die 12 having a surface on which convex portions are formed and a pressurizing die 13 having a flat surface, and the plate-shaped glass 1 is heated at a temperature equal to or higher than the softening point while being pressed by the pressurizing die 13. As the material of the receiving die 12 and the pressurizing die 13, a carbon material that has superior mold releasability for glass is used.

Figure 3C:
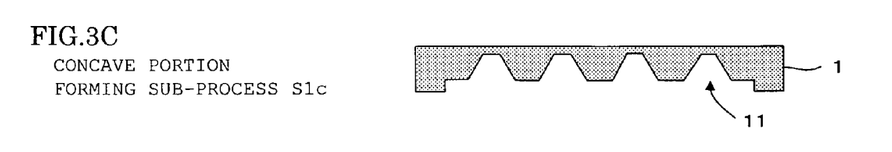
Figure 3D:
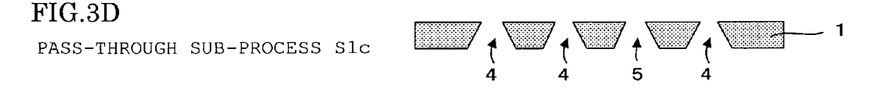

FIG. 3C illustrates a state in which the plate-shaped glass 1 is cooled and is taken out from the dies. On one surface of the plate-shaped glass 1, a plurality of concave portions 11 transferred from the convex portions of the receiving die 12 is formed. Next, in the pass-through sub-process S1c, as illustrated in FIG. 3D, a surface that is opposite to the one surface of the plate-shaped glass 1 is ground, so that the plurality of concave portions 11 passes through from the one surface to the other surface. Accordingly, three electrode through holes 4 are formed, and one dummy through hole 5 is formed therebetween. Each through hole has a trapezoidal shape of which a cross-section is a circular truncated cone so as to have good mold releasability. The layout of the electrode through holes 4 and the dummy through hole 5 will be described in detail in the second to eighth embodiments.

Figure 3E:
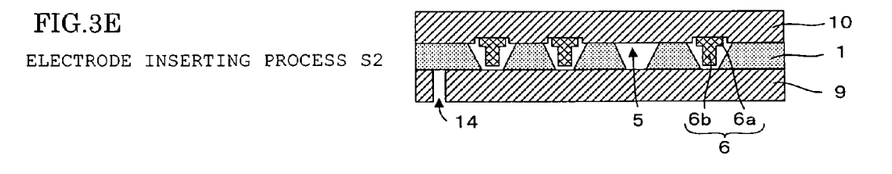
Figure 3F:
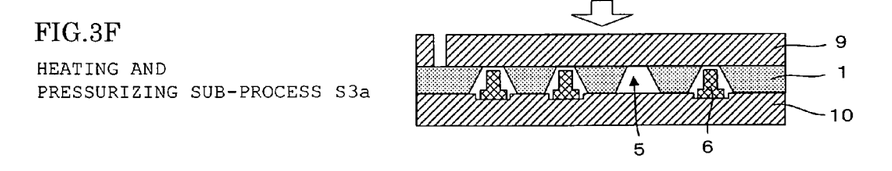

Next, in the electrode inserting process S2, as illustrated in FIG. 3E, a pin 6b of an electrode member 6 acquired by arranging the pin 6b so as to stand erect on a base 6a is installed to an electrode through hole 4, and the electrode member is installed between the pressurizing die 9 and the receiving die 10. It is preferable that the material of the electrode member 6 has a thermal expansion coefficient that is close to that of the plate-shaped glass 1. In this embodiment, a "42 alloy" as a Fe—Ni alloy is used. In the pressurizing die 9, a slit 14 that is used for extracting remaining air bubbles to the outside is arranged. The receiving die 10 has concave portions used for receiving the base 6a. Next, in a heating and pressurizing sub-process S3a of the welding process S3, as illustrated in FIG. 3F, the pressurizing die 9 and the receiving die 10 are vertically reversed, and the plate-shaped glass 1 is heated at a temperature (for example, 900° C.) equal to or higher than the softening point of the plate-shaped glass 1 while pressing the pressurizing die 9 (for example, 30 g to 50 g/cm²). Then, the glass material is softened so as to flow, and the side face of the pin 6b and the inner wall face of the electrode through hole 4 are welded.

Figure 3G:
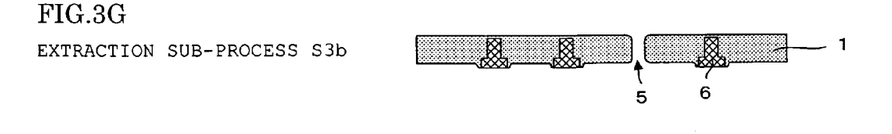

Next, in an extraction sub-process S3b of the welding process S3, the plate-shaped glass 1 is cooled, and, as illustrated in FIG. 3G, the plate-shaped glass 1 is taken out from the dies. The dummy through hole 5 can reduce the bent state or the distortion of the plate-shaped glass 1 by alleviating the internal stress of the glass. In addition, the cooling of the plate-shaped glass 1 can be configured such that the cooling rate for the range from a temperature higher than the strain point of the plate-shaped glass 1 by 50° C. to a temperature lower than the strain point by 50° C. is slower than that for the range up to a temperature higher than the strain point by 50° C. Accordingly, the residual distortion of the plate-shaped glass 1 is reduced, whereby the occurrence of a gap or a crack on the boundary face of the pin 6b and the plate-shaped glass 1 due to a difference in the thermal expansion can be prevented.

Figure 3H:
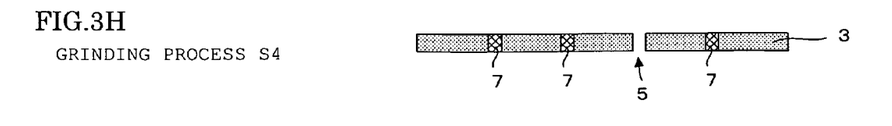

Next, in the grinding process S4, as illustrated in FIG. 3H, both sides of the plate-shaped glass 1 are ground and polished together with the electrode members 6, so that a glass substrate 3, to which a through electrode 7 is attached, is formed in which each electrode member 6 is exposed to both sides thereof. By forming the dummy through hole 5 between the through electrodes 7, the internal stress is alleviated, whereby a through electrode-attached glass substrate having superior flatness and high airtightness can be formed.

Second Embodiment

Figure 4:
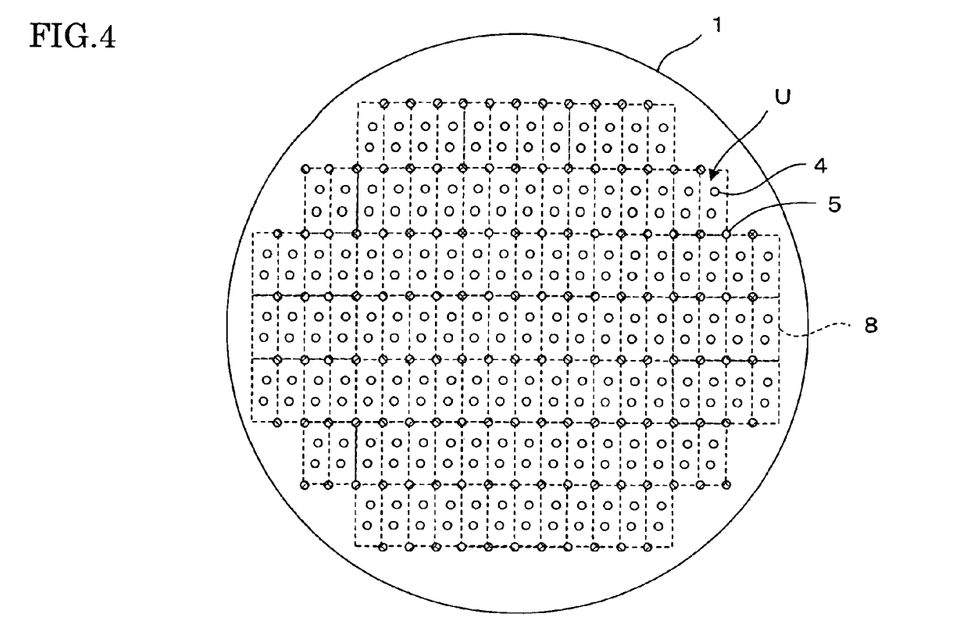
FIG. 4 is a diagram illustrating a method of manufacturing a glass substrate according to an embodiment of the invention and shows the layout of electrode through holes and dummy through holes.

FIG. 4 illustrates a method of manufacturing a through electrode-attached glass substrate according to the second embodiment of the invention and shows a layout of electrode through holes 4 and dummy through holes 5 that are formed in the through hole forming process S1. The process of manufacturing the glass substrate 3 is the same as that according to the first embodiment, and thus the description thereof is omitted.

As illustrated in FIG. 4, a plurality of unit cells U divided by cutout lines 8 is arranged on the surface of a plate-shaped glass 1. The cutout lines 8 are lines that are used for cutting out and dividing a wafer of a glass substrate 3 into the plurality of unit cells U. In each unit cell U, a plurality of electrode through holes 4 is formed. In addition, in a corner portion between adjacent unit cells U that is located on the cutout line 8, a dummy through hole 5 is formed. The dummy through hole 5 has a shape having the same area as the electrode through hole 4 on the same horizontal cross section. However, the shape of the dummy through hole 5 is not limited thereto. The horizontal cross-section of the dummy through hole 5 may have a quadrangle shape, a rectangle shape, or a cross shape. In addition, the area of the horizontal cross-section of the dummy through hole 5 may be determined to be greater or less than that of the horizontal cross-section of the electrode through hole 4 as appropriate. Furthermore, instead of installing the dummy through hole 5 at the corner portion of the unit cell U, the dummy through hole 5 may be installed at the center portion of a longer side or a shorter side between adjacent unit cells U. Accordingly, the dummy through hole 5 can improve the flatness of the glass substrate 3 by reducing the internal stress generated in the unit cell U.

Third Embodiment

Figure 5:
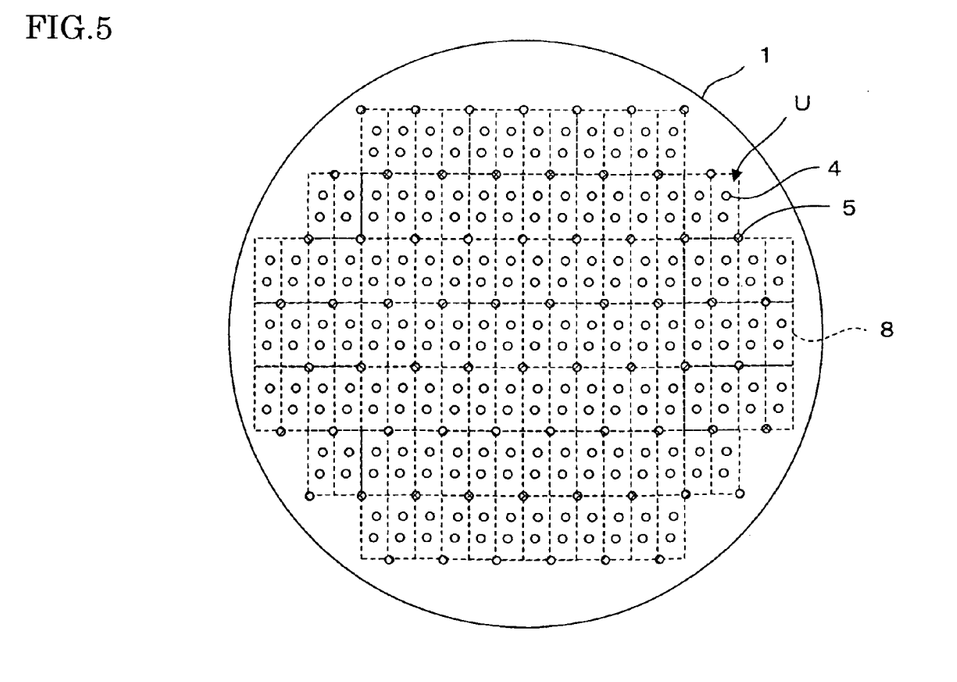
FIG. 5 is a diagram illustrating a method of manufacturing a glass substrate according to an embodiment of the invention and shows the layout of electrode through holes and dummy through holes.

FIG. 5 illustrates a method of manufacturing a through electrode-attached glass substrate according to the third embodiment of the invention and shows another layout of electrode through holes 4 and dummy through holes 5 that are formed in the through hole forming process S1. A difference between the second and third embodiments is that, instead of installing the dummy through hole 5 in all the corner portions of the unit cell U, the dummy through hole 5 is installed at every other corner portion of the unit cells U in the third embodiment. The process of manufacturing a glass substrate 3 is the same as that according to the first embodiment, and thus the description thereof is omitted. As illustrated in FIG. 5, by installing the dummy through hole 5 at every other corner portion of the unit cell U, the amount of flow of the glass decreases, and accordingly, the plate thickness of the corner portion of the unit cell U can be prevented from being thinned. Furthermore, instead of installing the dummy through hole 5 every other unit cells U, the dummy through hole 5 may be installed every third unit cell or installed with a larger gap.

Fourth Embodiment

Figure 6:
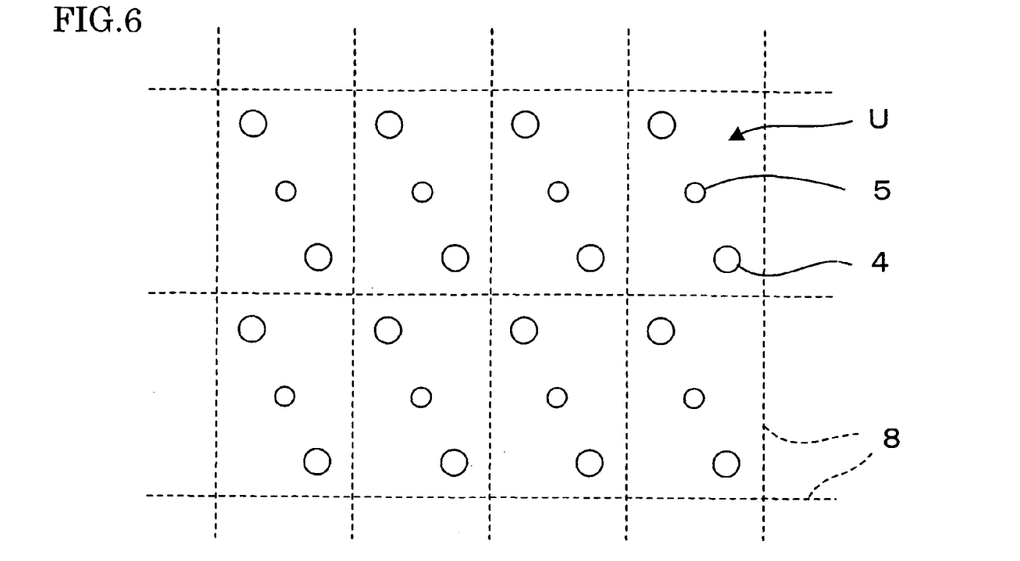
FIG. 6 is a diagram illustrating a method of manufacturing a glass substrate according to an embodiment of the invention and shows the layout of electrode through holes and dummy through holes.

FIG. 6 illustrates a method of manufacturing a through electrode-attached glass substrate according to the fourth embodiment of the invention and shows a further layout of electrode through holes 4 and dummy through holes 5 that are formed in the through hole forming process S1. A difference between the second and third embodiments and the fourth embodiment is that the dummy through hole 5 is installed inside each unit cell U in the fourth embodiment. The process of manufacturing a glass substrate 3 is the same as that according to the first embodiment, and thus the description thereof is omitted.

As illustrated in FIG. 6, the dummy through hole 5 is formed at a center position of two electrode through holes 4 formed within the unit cell U. In addition, the area of the horizontal cross-section of the dummy through hole 5 is formed to be less than that of the horizontal cross-section of the electrode through hole 4. Accordingly, the internal stress generated inside the unit cell U is reduced by the dummy through hole 5, whereby the flatness of the glass substrate 3 is improved. In a welding process S3 performed thereafter, the dummy through hole 5 is closed in accordance with the flow of the glass. Accordingly, there is no problem in using each unit cell U as a package of an electronic component.

Fifth Embodiment

Figure 7:
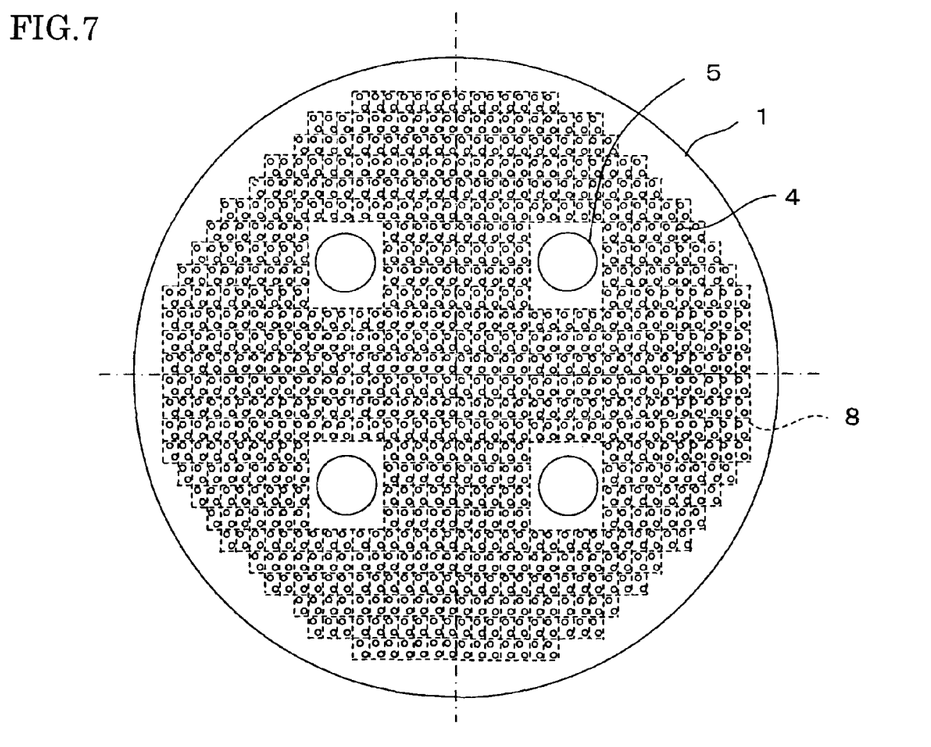
FIG. 7 is a diagram illustrating a method of manufacturing a glass substrate according to an embodiment of the invention and shows the layout of electrode through holes and dummy through holes.

FIG. 7 illustrates a method of manufacturing a through electrode-attached glass substrate according to the fifth embodiment of the invention and shows a still further layout of electrode through holes 4 and dummy through holes 5 that are formed in the through hole forming process S1. A difference between the second to fourth embodiments and the fifth embodiment is that the dummy through hole 5 is formed for each area acquired by equally dividing the plate-shaped glass 1 in the fifth embodiment. The process of manufacturing a glass substrate 3 is the same as that according to the first embodiment, and thus the description thereof is omitted.

As illustrated in FIG. 7, the plate-shaped glass 1 is divided into four portions having the same area with the center point thereof used as the center, and the dummy through hole 5 is formed at an approximately center portion of each divided area. The horizontal cross-section of the dummy through hole 5 has a circle shape. Accordingly, the internal stress generated within a predetermined area of the plate-shaped glass 1 is alleviated by the dummy through hole 5 installed at an approximate center portion thereof, whereby the flatness of the entire glass substrate 3 is improved. In addition, according to an embodiment of the invention, the plate-shaped glass 1 is not limited to be divided into four portions and may be divided into two to eight portions. In a case where the plate-shaped glass 1 is divided into eight or more portions, the center portion of the plate-shaped glass 1 is located far away from the dummy through hole 5, and accordingly, residual stress may easily be generated at the center portion. In addition, the shape of the dummy through hole 5 is not limited to a circle shape and may be a quadrangle shape or another polygon shape. Furthermore, the area of the horizontal cross-section of the dummy through hole 5 is appropriately determined.

Sixth Embodiment

Figure 8:
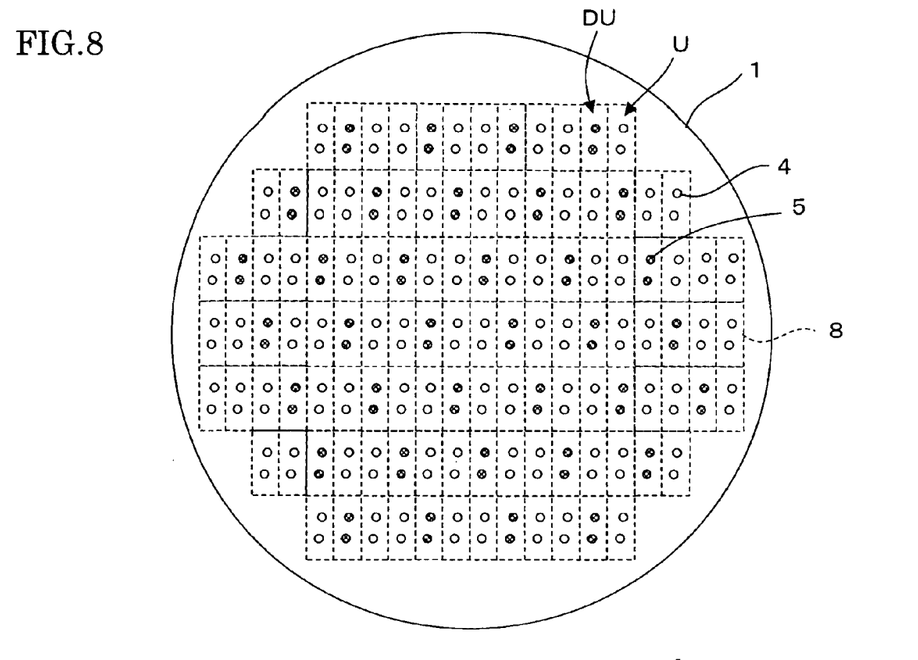
FIG. 8 is a diagram illustrating a method of manufacturing a glass substrate according to an embodiment of the invention and shows the layout of electrode through holes and dummy through holes.

FIG. 8 illustrates a method of manufacturing a through electrode-attached glass substrate according to the sixth embodiment of the invention and shows a still further layout of electrode through holes 4 and dummy through holes 5 that are formed in the through hole forming process S1. A difference between the second to fifth embodiments and the sixth embodiment is that a part of the unit cell U formed on the surface of the plate-shaped glass 1 is used as a dummy unit cell DU in the sixth embodiment. The process of manufacturing a glass substrate 3 is the same as that according to the first embodiment, and thus the description thereof is omitted.

As illustrated in FIG. 8, the dummy unit cell DU forming the dummy through hole 5 is installed in the middle of the arrangement of the unit cells U as the minimal areas that are separated and cut out. One of three unit cells U arranged along the horizontal and vertical cutout lines 8 is set as the dummy unit cell DU. In addition, the dummy unit cells DU are not limited to be distributed uniformly on the substrate face, and the distribution density of the dummy unit cells DU may be changed from the center portion of the substrate to the periphery portion of the substrate as needed. In the electrode inserting process S2, the position of insertion of the electrode member 6 can be determined in accordance with the bent state of the glass substrate 3.

Seventh Embodiment

Figure 9:
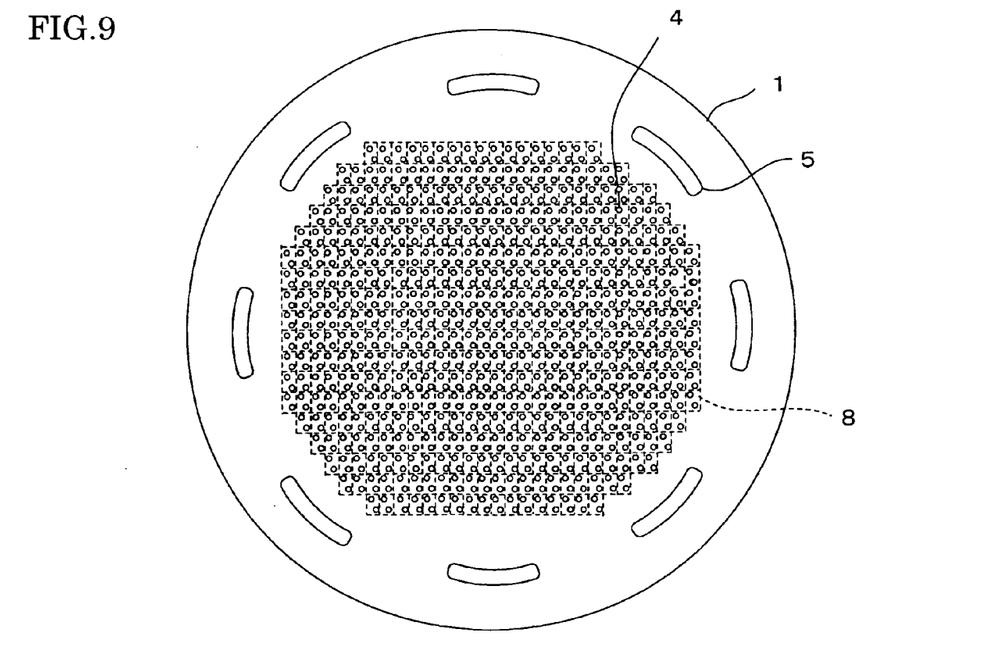
FIG. 9 is a diagram illustrating a method of manufacturing a glass substrate according to an embodiment of the invention and shows the layout of electrode through holes and dummy through holes.

FIG. 9 illustrates a method of manufacturing a through electrode-attached glass substrate according to the seventh embodiment of the invention and shows a still further layout of electrode through holes 4 and dummy through holes 5 that are formed in the through hole forming process S1. A difference between the second to sixth embodiments and the seventh embodiment is that dummy through holes 5 are formed on the outer periphery portion of the plate-shaped glass 1 in the seventh embodiment. The process of manufacturing a glass substrate 3 is the same as that according to the first embodiment, and thus the description thereof is omitted.

As illustrated in FIG. 9, a plurality of electrode through holes 4 is formed in the center area of the plate-shaped glass 1, and a plurality of the dummy through holes 5 is formed in the outer periphery area that is located on the outer periphery side relative to the center area of the plate-shaped glass 1. To be more specific, in an area located on the outer periphery side of the plate-shaped glass 1 having a disk shape in which the electrode through hole 4 is not formed, eight long and thin dummy through holes 5 having an arc shape are formed. Accordingly, the residual stress in the outer periphery area in which the through electrode 7 is not formed is reduced, and the degree of the bent state of the glass substrate 3 is lowered. In addition, the number of the dummy through holes 5 is not limited to eight. Furthermore, the shape of the dummy through hole 5 is not limited to an arc shape and may have a circle shape, an oval shape, a rectangle shape, or the like.

Eighth Embodiment

Figure 10:
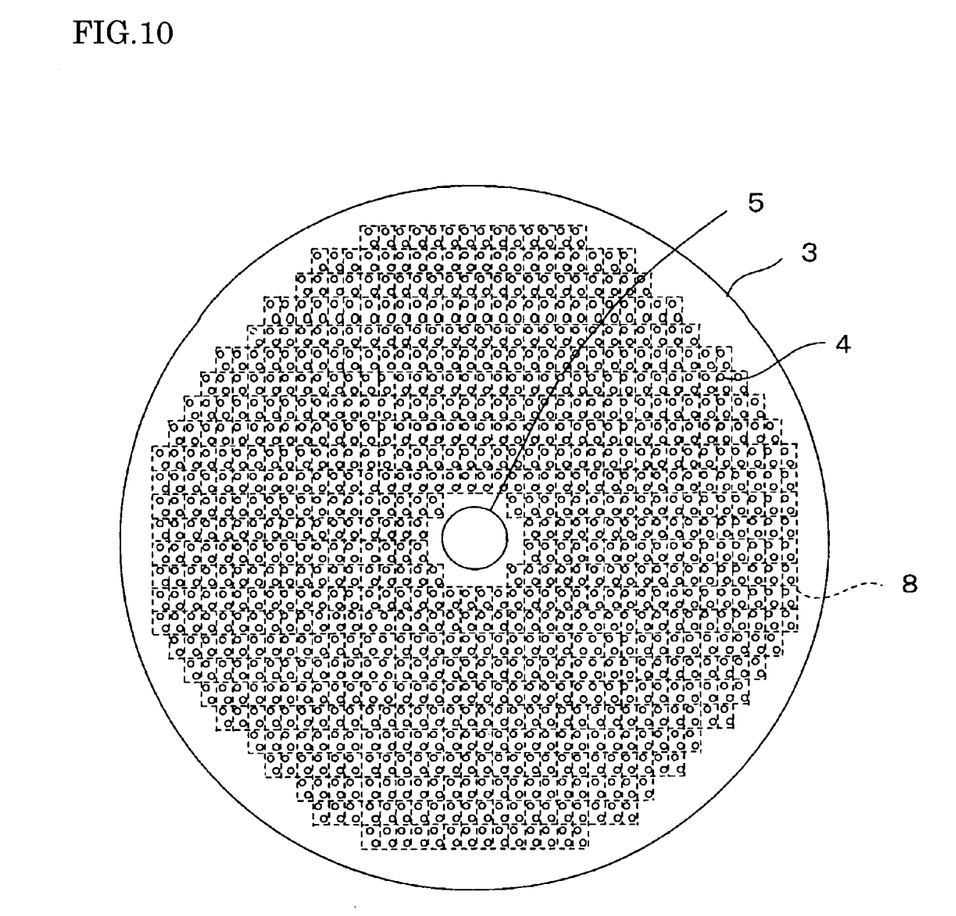
FIG. 10 is a diagram illustrating a method of manufacturing a glass substrate according to an embodiment of the invention and shows the layout of electrode through holes and dummy through holes.

FIG. 10 illustrates a method of manufacturing a through electrode-attached glass substrate according to the eighth embodiment of the invention and shows a still further layout of electrode through holes 4 and dummy through holes 5 that are formed in the through hole forming process S1. A difference between the second to seventh embodiments and the eighth embodiment is that a dummy through hole 5 is formed in the center portion of the plate-shaped glass 1 in the eighth embodiment. The process of manufacturing a glass substrate 3 is the same as that according to the first embodiment, and thus the description thereof is omitted. As illustrated in FIG. 10, the dummy through hole 5 having a circle shape is formed in the center portion of the plate-shaped glass 1. Accordingly, the residual stress in the center portion of the plate-shaped glass 1 is alleviated, and therefore the degree of the bent state of the glass substrate 3 can be lowered. In addition, the shape of the dummy through hole 5 may be a circle shape or a rectangle shape. The area of the dummy through hole 5 can be appropriately determined.

As described above, in the second to eighth embodiments, the external dimension of the glass substrate 3 is in the range of 1 inch to 4 inches, the thickness thereof is in the range of 0.2 to 0.6 mm, the size of the unit cell is in the range of 1 mm to 3 mm, and the diameter of the through electrode 7 is in the range of 0.05 mm to 1 mm. In addition, although examples have been illustrated in which two through electrodes 7 are installed in an effective unit cell EU, it is apparent that three or more through electrodes 7 may be formed.

Ninth Embodiment

Figure 11:
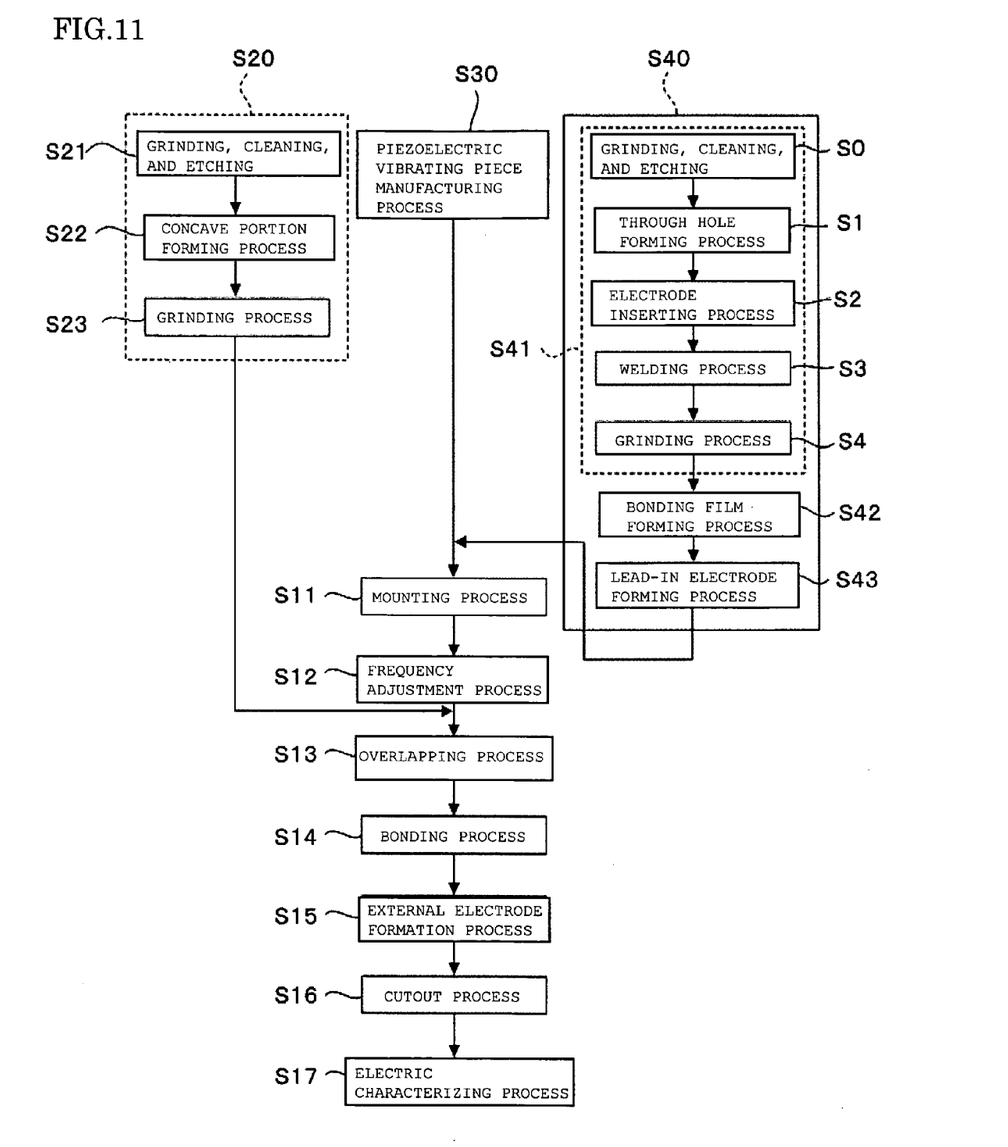
FIG. 11 is a process diagram illustrating a method of manufacturing an electronic component according to an embodiment of the invention.
Figure 12:
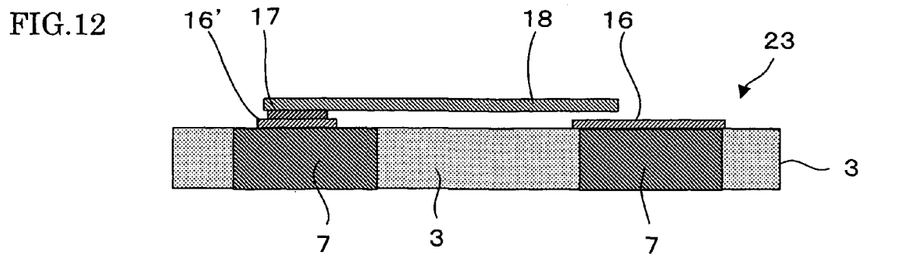
FIG. 12 illustrates a method of manufacturing an electronic component according to an embodiment of the invention and is a schematic cross-sectional view illustrating a state in which a piezoelectric vibrating piece is mounted on a glass substrate.
Figure 13:
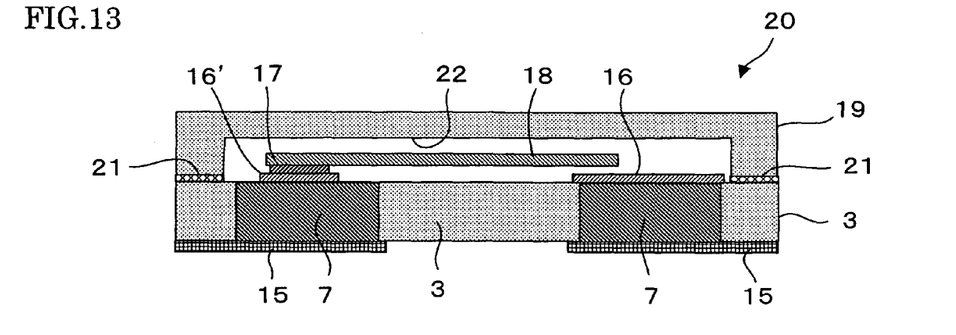
FIG. 13 illustrates a method of manufacturing an electronic component according to an embodiment of the invention and is a schematic cross-sectional view of a piezoelectric vibrator.

FIG. 11 is a process diagram illustrating a method of manufacturing an electronic component according to the ninth embodiment of the invention. An example is illustrated therein in which a piezoelectric vibrator is used as an electronic component that is mounted on the glass substrate. FIG. 12 is a schematic cross-sectional view illustrating a state in which a piezoelectric vibrating piece 18 is mounted on a glass substrate 3 in which through electrodes 7 are formed, and FIG. 13 is a schematic cross-sectional view of a completed piezoelectric vibrator 20. According to this ninth embodiment, a base substrate forming process S40, a lid substrate forming process S20, and a piezoelectric vibrating piece manufacturing process S30 are included. Hereinafter, these will be sequentially described as below.

First, in a polishing, cleaning, and etching process S0, plate-shaped glass 1 is prepared, and a polishing process, a cleaning process, an etching process, and the like are performed. In addition, in order to form a through electrode 7, for example, an electrode member 6 is prepared in which a pin 6b is arranged so as to stand erect on a base 6a. In the through hole forming process S1, a plurality of electrode through holes 4 and a dummy through hole 5 are formed in the plate-shaped glass 1. In the case of multiple patterning in which a plurality of unit cells U is formed in the plate-shaped glass 1, it is preferable that the plate-shaped glass 1 is heated at a temperature that is equal to or higher than the softening point thereof, the plate-shaped glass 1 is pressed by a die in which a plurality of convex portions is formed so as to concurrently form a plurality of concave portions on the surface of the plate-shaped glass 1, and, next, the plate-shaped glass 1 is ground so as to form a plurality of electrode through holes 4 and a dummy through hole 5.

Next, in the electrode inserting process S2, electrode members 6 are inserted into the electrode through holes 4. Next, in the welding process S3, the plate-shaped glass 1 is heated at a temperature higher than the softening point thereof, whereby the plate-shaped glass 1 and the electrode members 6 are welded. Then, the plate-shaped glass 1 to which the electrode members 6 are installed is interposed between the receiving die 10 and the pressurizing die 9, and the plate-shaped glass 1 is welded while pressing the pressurizing die 9. Accordingly, the flow of the glass is promoted, whereby the welding time can be shortened. Next, the plate-shaped glass 1 is cooled and is taken out from the dies. Next, in the grinding process S4, both sides of the plate-shaped glass 1 are ground so as to expose a plurality of the electrode members 6 to the surface thereof. As above, a glass substrate 3, in which the plurality of the through electrodes 7 being electrically separated from each other is formed, having good flatness is acquired. A glass substrate forming process S41 is as described above.

Next, in a bonding film forming process S42, a bonding film that is used for anode bonding is deposited on the outer periphery area of each unit cell U of the glass substrate 3. As the bonding film, an aluminum film is deposited. Next, in a lead-in electrode forming process S43, lead-in electrode 16 is formed from the surface of one through electrode 7 along the outer periphery portion of the glass substrate 3 so as to be configured as a base substrate 23. The lead-in electrodes 16 and 16' are formed by depositing an Au/Cr film using a sputtering method and patterning the film through a photolithographic process and an etching process. Instead of the sputtering method, the lead-in electrodes 16 and 16' may be formed by using a printing method or the like. The base substrate forming process S40 has been described as above.

Next, the lid substrate forming process S20 will be described. It is preferable that the material of the lid substrate 19 is the same as that of the base substrate 23 so as to decrease a difference in the thermal expansion when the lid substrate 19 is bonded to the base substrate 23. In a case where soda-lime glass is used as the material of the base substrate 23, soda-lime glass that is the same as the material of the base substrate 23 is used as the material of the lid substrate 19. First, in a grinding, cleaning, and etching process S21, the glass substrate is ground, an etching process is performed for the glass substrate so as to remove an affected layer located on the uppermost surface, and the glass substrate is cleaned.

Next, in a concave portion forming process S22, a concave portion 22 is formed through die molding. The concave portion 22 is molded by interposing a glass substrate between a receiving die having a convex portion and a pressurizing die having a concave portion and heating the glass substrate at a temperature equal to or higher than the softening point of the glass and pressing the glass substrate. The molding die is preferably formed of a carbon material. The reason for this is that the carbon material has superior mold releasability for glass and superior absorbency of air bubbles. Next, in a grinding process S23, a bonding face to be bonded to the base substrate 23 is ground so as to be a flat face. Accordingly, the sealability at a time when the glass substrate is bonded to the base substrate 23 can be improved.

Next, in a piezoelectric vibrating piece manufacturing process S30, a piezoelectric vibrating piece 18 that is configured by a quartz crystal substrate is prepared. On both surfaces of the piezoelectric vibrating piece 18, excitation electrodes, which are not shown in the figure, being electrically separated from each other are formed and are electrically connected to terminal electrodes formed on the surface of one end of the piezoelectric vibrating piece 18. Next, in a mounting process S11, a conductive adhesive 17, for example, a gold bump is formed in end portions of the through electrode 7 and the lead-in electrode 16' of the base substrate 23 or the terminal electrode of the piezoelectric vibrating piece 18. The piezoelectric vibrating piece 18 is mounted using the conductive adhesive 17 in a cantilever shape supported on one side.

Accordingly, the excitation electrodes formed on both sides of the piezoelectric vibrating piece 18 are electrically separated from each other and are conductive with two through electrodes 7.

Next, in a frequency adjusting process S12, the vibration frequency of the piezoelectric vibrating piece 18 is adjusted to a predetermined frequency. Next, in an overlapping process S13, the lid substrate 19 is installed on the base substrate 23 and overlaps each other through a bonding material 21. Next, in a bonding process S14, the base substrate 23 and the lid substrate 19 overlapping each other are heated, and a high voltage is applied between the base substrate 23 and the lid substrate 19 for anode bonding. Next, in an external electrode forming process S15, external electrodes 15 electrically connected to the through electrodes 7 are formed on the outer face of the base substrate 23. Next, in a cutout process S16, individual piezoelectric vibrators 20 are acquired by separating and cutting them out along the cutout line 8.

As described above, the residual internal stress is reduced by forming the dummy through hole 5 in the plate-shaped glass 1 in addition to the electrode through holes 4, and accordingly, a glass substrate 3, to which through electrodes 7 are attached, having flatness and superior airtightness can be manufactured. Therefore, a piezoelectric vibrator 20 having high reliability can be provided. In addition, in the above-described embodiment, the external electrodes 15 formed in the external electrode forming process S15 may be formed in advance in the glass substrate forming process S40. Furthermore, the frequency adjusting process S12 may be performed after the cutout process S16.

Figure 14:
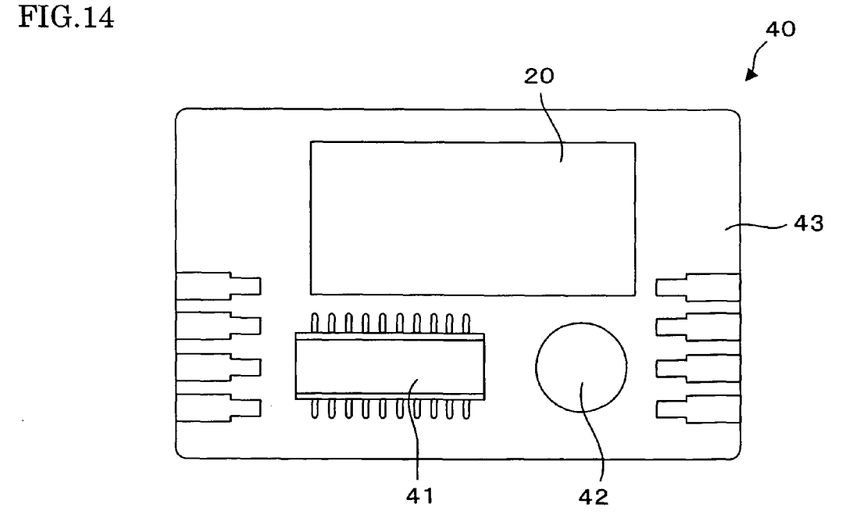
FIG. 14 is a schematic diagram illustrating the surface of an oscillator in which a piezoelectric vibrator manufactured by using a method of manufacturing an electronic component according to an embodiment of the invention is built.

FIG. 14 is a schematic diagram illustrating the surface of an oscillator 40 in which a piezoelectric vibrator 20 manufactured by using a manufacturing method according to the ninth embodiment is built. As illustrated in FIG. 14, the oscillator 40 includes a substrate 43, a piezoelectric vibrator 20 installed on this substrate, an integrated circuit 41, and an electronic component 42. The piezoelectric vibrator 20 generates a signal of a constant frequency based on driving signals supplied to the external electrodes 6 and 7, and the integrated circuit 41 and the electronic component 42 generate a reference signal such as a clock signal by processing signals of the constant frequency that are supplied from the piezoelectric vibrator 20. Since the piezoelectric vibrator 20 according to an embodiment of the invention can be formed to have high reliability in a small size, the entire oscillator 40 can be configured in a compact manner.

What is claimed is:

1. A method of manufacturing a through electrode-attached glass substrate, the method comprising:
    forming a plurality of electrode through holes and as least one dummy through hole in a plate-shaped glass;
    inserting electrode members into the electrode through holes;
    welding the plate-shaped glass and the electrode members by heating the plate-shaped glass at a temperature that is higher than a softening point of the plate-shaped glass so that the glass is allowed to flow into and close the at least one dummy through hole; and
    grinding both sides of the plate-shaped glass together with the electrode members so as to expose a plurality of the electrode members to both sides of the plate-shaped glass and to configure the plurality of the electrode members as a plurality of through electrodes that are electrically separated from each other,
    wherein in the inserting of the electrode members, a pin of each of the electrode members in which the pin is arranged so as to be erected on a base is inserted into the electrode through hole, and
    wherein in the welding of the plate-shaped glass and the electrode members, the plate-shaped glass into which the plurality of pins is inserted is interposed between a receiving die and a pressurizing die and is pressed.

2. The method according to claim 1; wherein the forming of the plurality of electrode through holes and the at least one dummy through hole includes:
    forming a plurality of concave portions on one surface of the plate-shaped glass by arranging a plurality of convex portions in either a receiving die or a pressurizing die, which are formed from carbon materials, and interposing and heating the plate-shaped glass between the receiving die and the pressurizing die; and
    grinding another surface of the plate-shaped glass located on a side opposite to the one surface to allow the plurality of concave portions to pass through from the one surface to the another surface of the plate-shaped glass.

3. A method of manufacturing a through electrode-attached glass substrate, the method comprising:
    forming a plurality of electrode through holes and at least one dummy through hole in a plate-shaped glass;
    inserting electrode members into the plurality of electrode through holes but not into the at least one dummy through-hole;
    welding the plate-shaped glass and the electrode members by heating the plate-shaped glass at a temperature higher than a softening point of the plate-shaped glass so that the glass is allowed to flow into the at least one dummy through hole; and
    grinding opposite surfaces of the plate-shaped glass together with the electrode members so as to expose the plurality of the electrode members to the opposite surfaces of the plate-shaped glass and to configure the plurality of the electrode members as a plurality of through electrodes that are electrically separated from each other,
    wherein the welding of the plate-shaped glass and the electrode members comprises interposing the plate-shaped glass between a receiving die and a pressurizing die and pressing the plate-shaped member.

4. A method of manufacturing a through electrode-attached glass substrate, the method comprising:
    forming a plurality of electrode through holes and at least one dummy through hole in a plate-shaped glass;
    inserting electrode members into the plurality of electrode through holes but not into the at least one dummy through-hole;
    welding the plate-shaped glass and the electrode members by heating the plate-shaped glass at a temperature higher than a softening point of the plate-shaped glass so that the glass is allowed to flow into the at least one dummy through hole; and
    grinding opposite surfaces of the plate-shaped glass together with the electrode members so as to expose the plurality of the electrode members to the opposite surfaces of the plate-shaped glass and to configure the plurality of the electrode members as a plurality of through electrodes that are electrically separated from each other,
    wherein the forming of the plurality of electrode through holes and the at least one dummy through hole includes:
    forming a plurality of concave portions on one surface of the plate-shaped glass by arranging a plurality of convex portions in one of a receiving die or a pressurizing die and interposing and heating the plate-shaped glass between the receiving die and the pressurizing die; and grinding another surface of the plate-shaped glass located on a side opposite to the one surface to allow the plurality of concave portions to pass through from the one surface to the another surface of the plate-shaped glass.

* * * * *